US008872327B2

(12) United States Patent  
Masunaga et al.

(10) Patent No.: US 8,872,327 B2  
(45) Date of Patent: Oct. 28, 2014

(54) SEMICONDUCTOR DEVICE

(71) Applicant: Kabushiki Kaisha Toshiba, Tokyo (JP)

(72) Inventors: Takayuki Masunaga, Yokkaichi (JP); Kazuhiro Ueda, Aisai (JP); Naotake Watanabe, Mie-gun (JP); Yoshiyuki Shimizu, Tokyo (JP); Hideo Nishiuchi, Kuwana (JP); Takashi Togasaki, Yokohama (JP); Satoshi Sayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/024,732

(22) Filed: Sep. 12, 2013

(65) Prior Publication Data

US 2014/0124909 A1    May 8, 2014

(30) Foreign Application Priority Data

Nov. 2, 2012   (JP) .................................. 2012-242865

(51) Int. Cl.
| | |
|---|---|
| *H01L 23/495* | (2006.01) |
| *H01L 23/492* | (2006.01) |
| *H01L 25/11* | (2006.01) |
| *H01L 23/498* | (2006.01) |
| *H01L 25/18* | (2006.01) |
| *H02M 7/00* | (2006.01) |

(52) U.S. Cl.
CPC ............ *H01L 23/495* (2013.01); *H01L 23/492* (2013.01); *H01L 25/115* (2013.01); *H01L 23/49575* (2013.01); *H01L 23/49811* (2013.01); *H01L 25/18* (2013.01); *H02M 7/003* (2013.01); *H01L 23/49562* (2013.01)  
USPC .......................................... 257/691; 257/706

(58) Field of Classification Search  
USPC ........... 257/666, 691, 706, 717, 720, E23.051  
See application file for complete search history.

(56) References Cited

U.S. PATENT DOCUMENTS

| | | | | |
|---|---|---|---|---|
| 6,710,439 | B2 * | 3/2004 | Lee et al. ...................... | 257/691 |
| 7,206,205 | B2 | 4/2007 | Obu et al. | |
| 7,605,456 | B2 | 10/2009 | Obu et al. | |
| 7,812,443 | B2 * | 10/2010 | Tokuyama et al. ........... | 257/706 |
| 2009/0237890 | A1 | 9/2009 | Sekiya et al. | |
| 2009/0302444 | A1 | 12/2009 | Ueda et al. | |

(Continued)

FOREIGN PATENT DOCUMENTS

| | | |
|---|---|---|
| DE | 10 2009 022221 A1 | 11/2009 |
| JP | 2003258166 | 9/2003 |
| JP | 2007068302 | 3/2007 |
| JP | 2009-099339 A | 5/2009 |

OTHER PUBLICATIONS

Extended European Search Report issued in related European Patent Application No. 13183667.8 mailed Feb. 19, 2014, 5 pages.

*Primary Examiner* — Roy Potter  
(74) *Attorney, Agent, or Firm* — Baker Botts L.L.P.

(57) ABSTRACT

According to one embodiment, a semiconductor device includes a first electrical conductor, a second electrical conductor, first and second semiconductors between the first and second electrical conductors, a first power terminal, a second power terminal, a signal terminal, and an insulator which covers the components. The insulator includes a flat bottom surface in which the first and second electrical conductors are exposed, a ceiling surface, a first end surface, and a second end surface. The power terminals and the signal terminal extend outwardly from the first and second end surfaces, and the ceiling surface, respectively. The first end surface, the ceiling surface, and the second end surface are formed with a parting line.

12 Claims, 14 Drawing Sheets

(56) References Cited

U.S. PATENT DOCUMENTS

| | | |
|---|---|---|
| 2011/0156797 A1 | 6/2011 | Ninomiya et al. |
| 2011/0278643 A1 | 11/2011 | Sato |
| 2012/0241953 A1 | 9/2012 | Yamada et al. |

\* cited by examiner

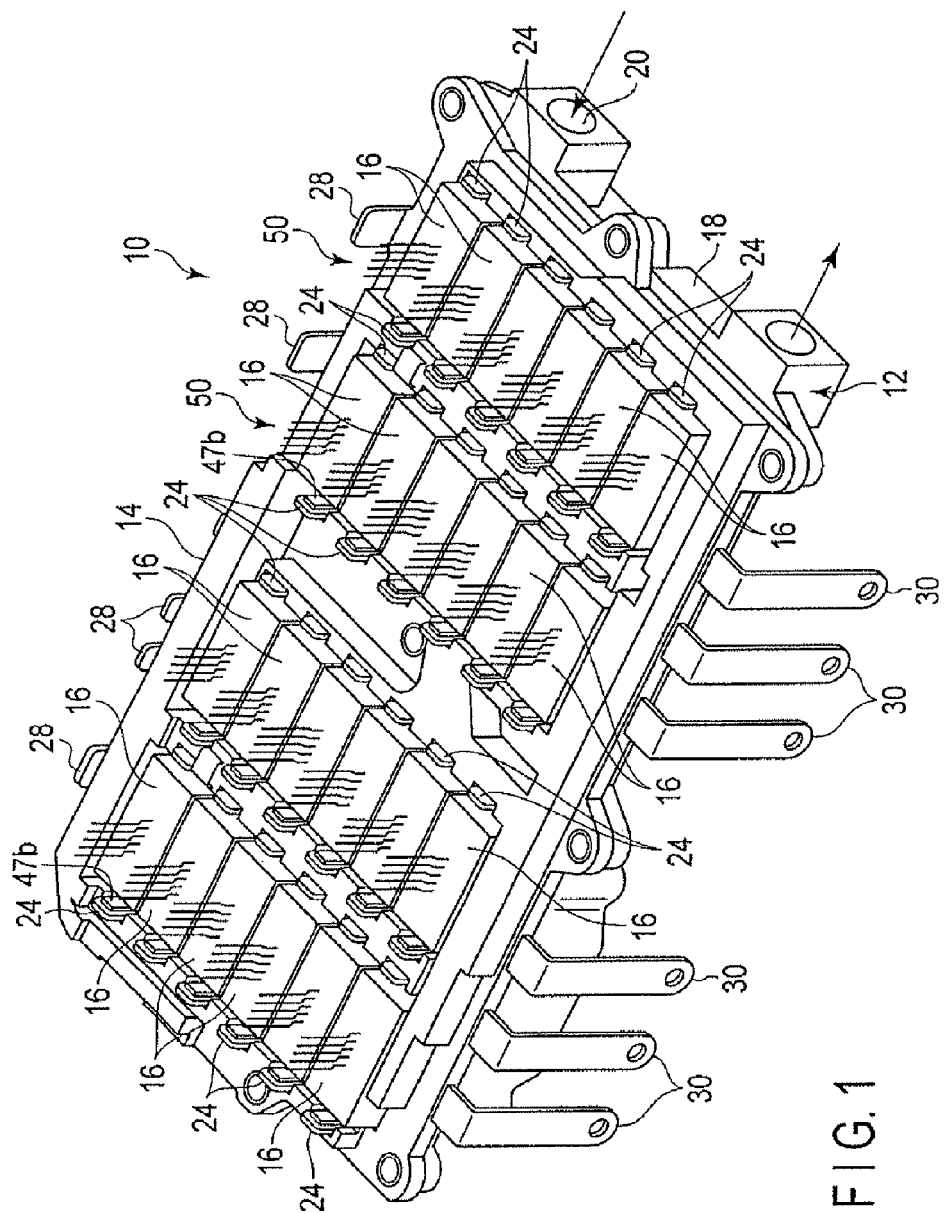
F I G. 1

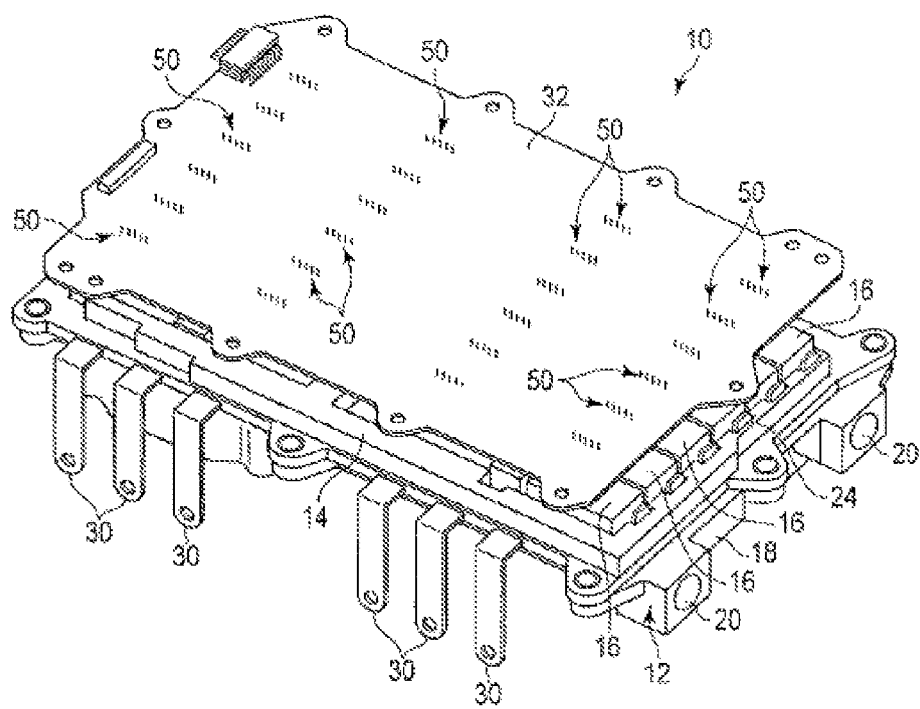
F I G. 3
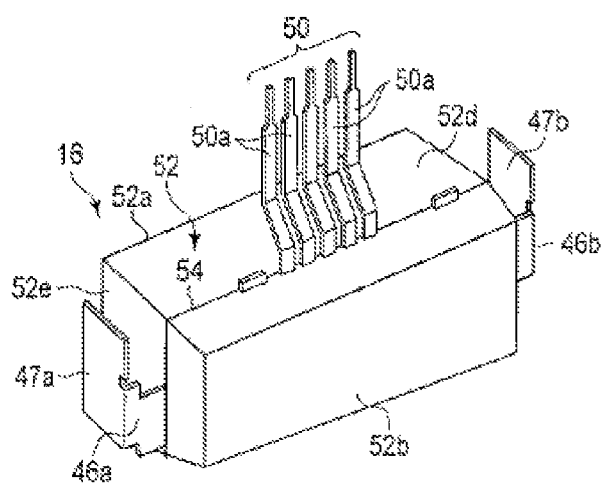
F I G. 4

Cooling water temperature: 20°C

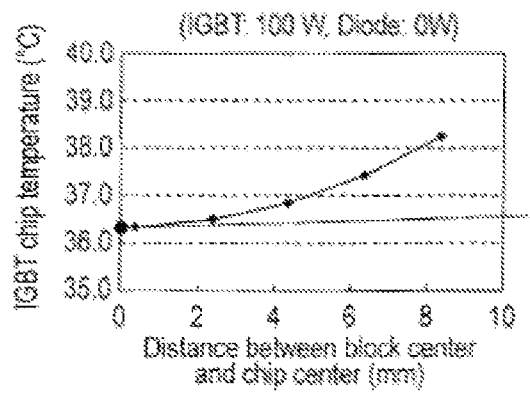 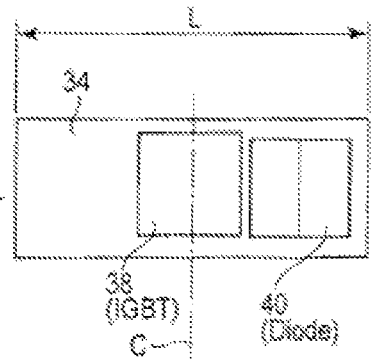
FIG. 15A  FIG. 15B
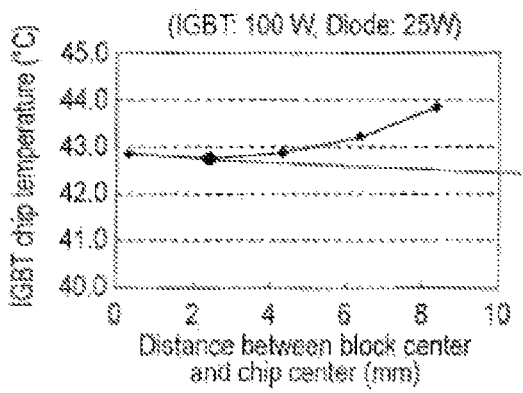 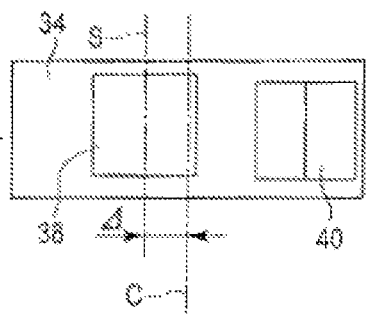
FIG. 15C  FIG. 15D
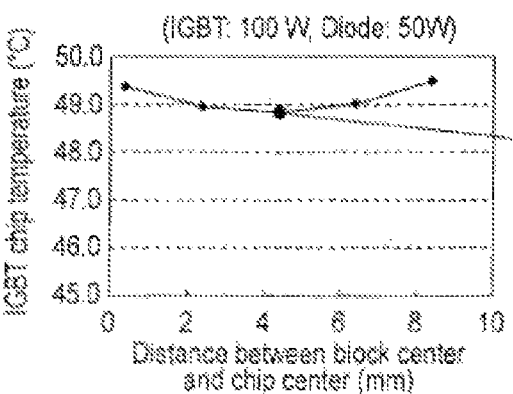 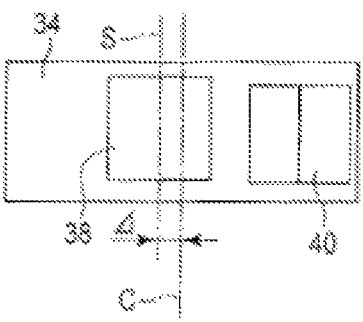
FIG. 15E  FIG. 15F

SEMICONDUCTOR DEVICE

CROSS-REFERENCE TO RELATED APPLICATIONS

This application is based upon and claims the benefit of priority from Japanese Patent Application No. 2012-242865, filed Nov. 2, 2012, the entire contents of which are incorporated herein by reference.

FIELD

Embodiments described herein relate generally to a semiconductor device used in a semiconductor power converter.

BACKGROUND

In recent years, hybrid vehicles that use an engine and a motor in combination have rapidly become widely used to achieve higher fuel efficiency. On the other hand, marketing of electric vehicles that can run by a motor alone is in progress. To be feasible, these vehicles require use of a power converter for AC/DC conversion between a battery and the motor.

In the hybrid and electric vehicles, the semiconductor power converter is expected to be small and highly reliable. To this end, the power converter requires high cooling efficiency. As a measure to achieve this, a power converter structure of the double-sided cooling type has been proposed in which electrical conductors are connected individually to the obverse and reverse surfaces of a semiconductor element and heat is released from the electrical conductors to a cooler.

A plurality of semiconductor devices (semiconductor modules) must be arranged in the semiconductor power converter. In the case where electricity is used to drive the axle of an automobile, high voltage and high current are applied such that the semiconductor devices produce much heat, thus requiring consideration of electrical insulation between terminals. It is difficult, therefore, to increase the packaging density of the semiconductor devices.

BRIEF DESCRIPTION OF THE DRAWINGS

FIG. 1 is a perspective view showing a semiconductor power converter according to a first embodiment with its control circuit board removed;

FIG. 3 is a perspective view showing the entire semiconductor power converter including the control circuit board;

FIG. 4 is a perspective view showing a semiconductor module (semiconductor device) of the semiconductor power converter;

FIG. 15A is a diagram showing the relationship between the temperature of the first semiconductor element and the distance from the longitudinal center of the first electrical conductor to the central position of the first semiconductor element;

FIG. 15B is a side view showing the arrangement of first and second semiconductor elements relative to a first electrical conductor;

FIG. 15C is a diagram showing the relationship between the temperature of the first semiconductor element and the distance from the longitudinal center of the first electrical conductor to the central position of the first semiconductor element;

FIG. 15D is a side view showing the arrangement of first and second semiconductor elements relative to a first electrical conductor;

FIG. 15E is a diagram showing the relationship between the temperature of the first semiconductor element and the distance from the longitudinal center of the first electrical conductor to the central position of the first semiconductor element;

FIG. 15F is a side view showing the arrangement of first and second semiconductor elements relative to a first electrical conductor;

DETAILED DESCRIPTION

Figure 2:
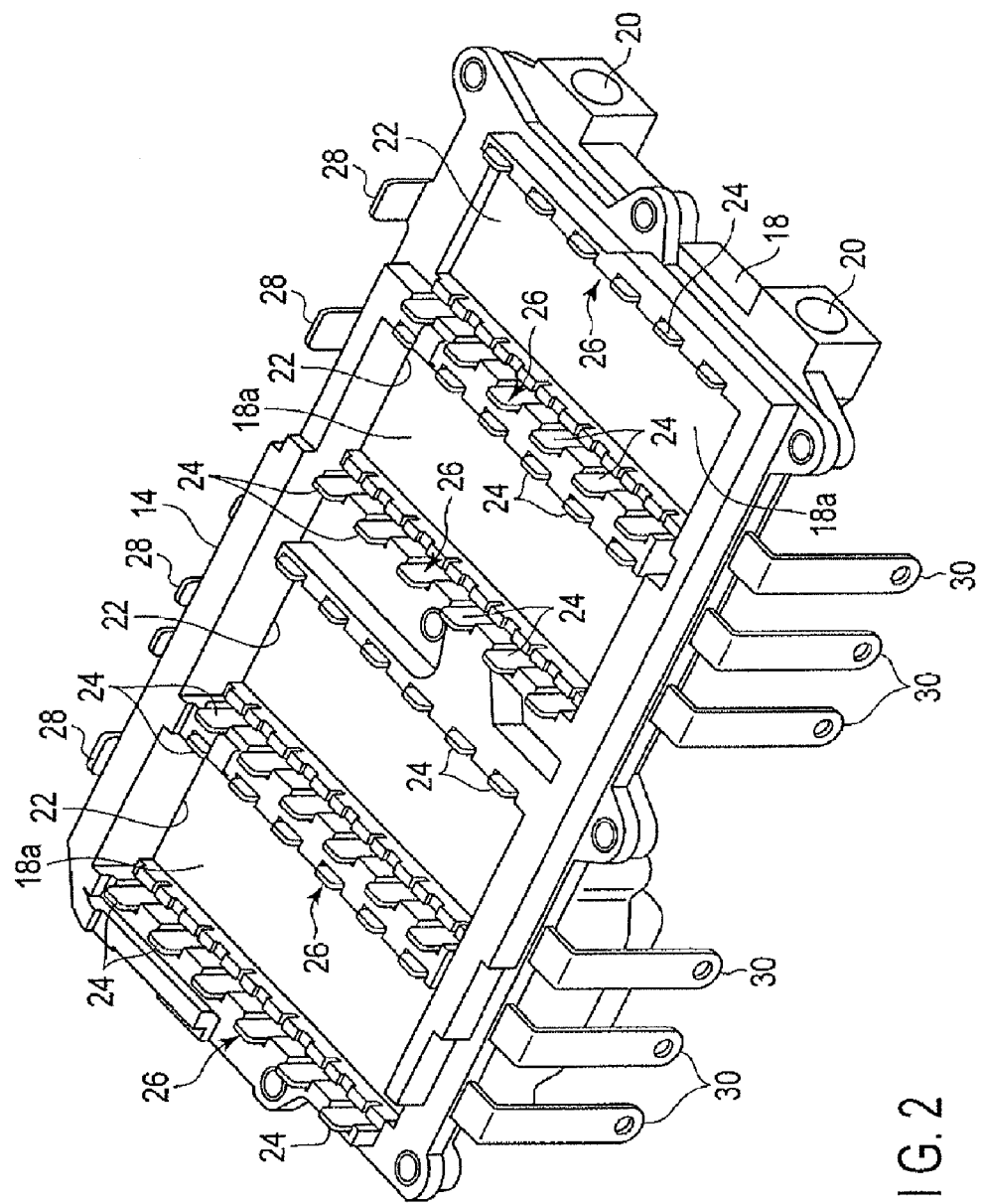
FIG. 2 is a perspective view showing a support frame and cooler of the semiconductor power converter.

Various embodiments will be described hereinafter with reference to the accompanying drawings. In general, according to one embodiment, a semiconductor device is characterized by comprising: a first electrical conductor comprising a first joint surface and a first bottom surface perpendicular to the first joint surface; a second electrical conductor comprising a second joint surface opposite the first joint surface and a second bottom surface perpendicular to the second joint surface and flush with the first bottom surface; a plate-shaped first semiconductor element which is disposed between the first and second electrical conductors, one electrode of which is joined to the first joint surface of the first electrical conductor, and the other electrode of which is connected to the second joint surface of the second electrical conductor; a plate-shaped second semiconductor element which is disposed between the first and second electrical conductors, one electrode of which is joined to the first joint surface of the first electrical conductor, and the other electrode of which is connected to the second joint surface of the second electrical conductor; a first power terminal comprising a proximal end portion joined to the first joint surface and extending outwardly from the first electrical conductor; a second power terminal extending outwardly relative to the second electrical conductor from the second joint surface; a signal terminal connected to the first semiconductor element; and a insulator which covers the proximal end portion of the first power terminal, a proximal end portion of the second power terminal, a proximal end portion of the signal terminal, and the first and second electrical conductors. The insulator comprises a flat bottom surface which extends perpendicular to the first and second semiconductor elements and in which the first bottom surface of the first electrical conductor and the second bottom surface of the second electrical conductor are exposed, a flat first lateral surface extending perpendicular to the bottom surface, a second lateral surface extending perpendicular to the bottom surface and opposed parallel to the first lateral surface, a ceiling surface located between the first and second lateral surfaces and opposed to the bottom surface, a first end surface extending across the bottom surface and respective one ends of the first and second lateral surfaces, and a second end surface extending across the bottom surface and the respective other ends of the first and second lateral surfaces. The first power terminal, the second power terminal, and the signal terminal extend outwardly from the first end surface, the second end surface, and the ceiling surface, respectively. The first end surface, the ceiling surface, and the second end surface of the insulator are formed with a parting line.

The drawings are schematic views for a better understanding of the embodiments, and the shapes, sizes, and proportions shown therein may be different from actual specifications. However, they may be suitably designed and modified in consideration of the following description and known techniques.

First Embodiment

FIG. 1 is a perspective view showing a semiconductor power converter according to a first embodiment with its control circuit board removed. FIG. 2 is a perspective view showing a support frame and cooler of the semiconductor power converter, and FIG. 3 is a perspective view showing the entire semiconductor power converter including the control circuit board.

As shown in FIGS. 1 to 3, a semiconductor power converter 10 comprises a cooler 12, support frame 14, and a plurality of semiconductor modules (semiconductor devices) 16. The support frame 14 is secured on the cooler 12. The semiconductor modules 16 are set on the cooler 12 and supported by the support frame. The cooler 12 comprises a flat cuboid cooling block 18 with a flat rectangular heat receiving surface 18a. The cooling block 18 is made of, for example, aluminum. Further, a refrigerant passage 20 through which a cooling medium, such as water, is passed is formed in the cooling block 18.

The support frame 14 integrally comprises a rectangular outer frame of a size corresponding to the heat receiving surface 18a and a plurality of coupling beams extending parallel to one another inside the outer frame. The outer frame and coupling beams define rectangular installation space portions 22 arranged in, for example, four rows. Further, the support frame 14 comprises bus bars 26, input terminals 28, and two sets of three-phase output terminals 30. Each bus bar 26 comprises a plurality of connecting terminals 24 electrically connected to the semiconductor modules 16, which will be described later. The connecting terminals 24 of the bus bars 26 are arranged at intervals along each side edge of each installation space portion 22. The support frame 14 is formed integrally with the terminals by, for example, insert-molding a resin. Further, the support frame 14 is secured on the heat receiving surface 18a of the cooling block 18 by, for example, screws.

As shown in FIG. 1, the semiconductor modules 16 are located, for example, in four rows each comprising six modules, on the support frame 14. In each row, the six semiconductor modules 16 are disposed in their corresponding installation space portion 22 of the support frame 14, and the bottom surface of each semiconductor module is located on the heat receiving surface 18a of the cooler 12 with an insulating sheet (not shown) therebetween. Respective power terminals of the semiconductor modules 16 contact their corresponding connecting terminals 24 of the bus bars 26 and are electrically connected to the bus bars 26. Further, a plurality of signal terminals 50 of each semiconductor module 16 projects upwardly.

As shown in FIG. 3, the semiconductor power converter 10 comprises a control circuit board 32, which controls the input/output and other operations of the semiconductor modules 16 and the entire device. The control circuit board 32 is in the form of a rectangular structure substantially as large as the support frame 14. The control circuit board 32 is superposed on the semiconductor modules 16 and attached to the support frame 14 by fixing screws (not shown) or the like. The signal terminals 50 of the semiconductor modules 16 are electrically connected to the control circuit board 32.

The following is a detailed description of one of the semiconductor modules (semiconductor devices) 16 that constitute the semiconductor power converter.

Figure 5:
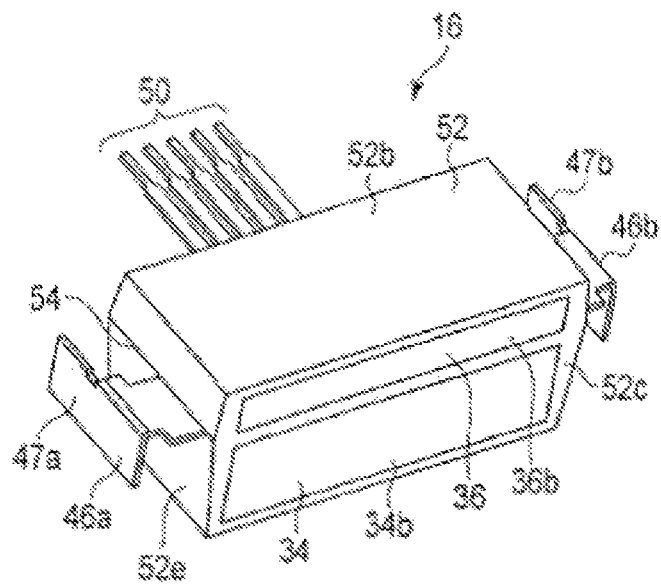
FIG. 5 is a perspective view of the semiconductor module taken from the bottom side.
Figure 6:
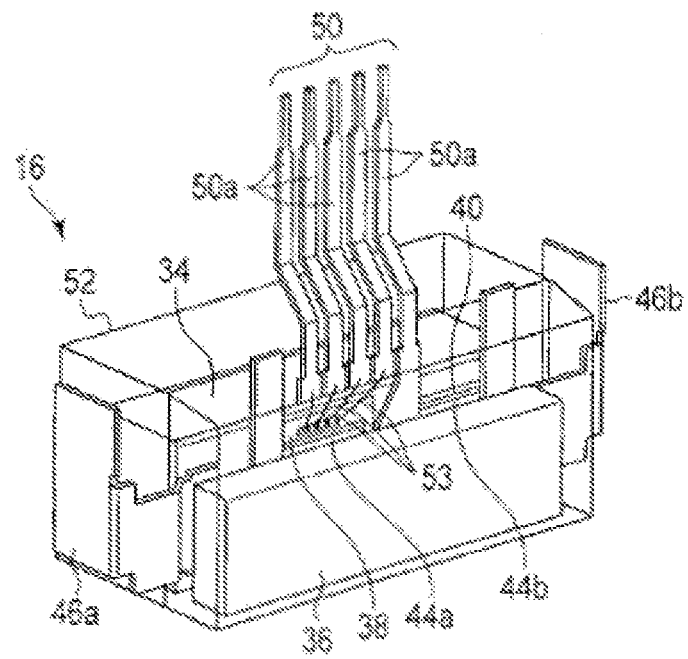
FIG. 6 is a perspective view showing the internal structure of the semiconductor module seen through a molded resin body.
Figure 7:
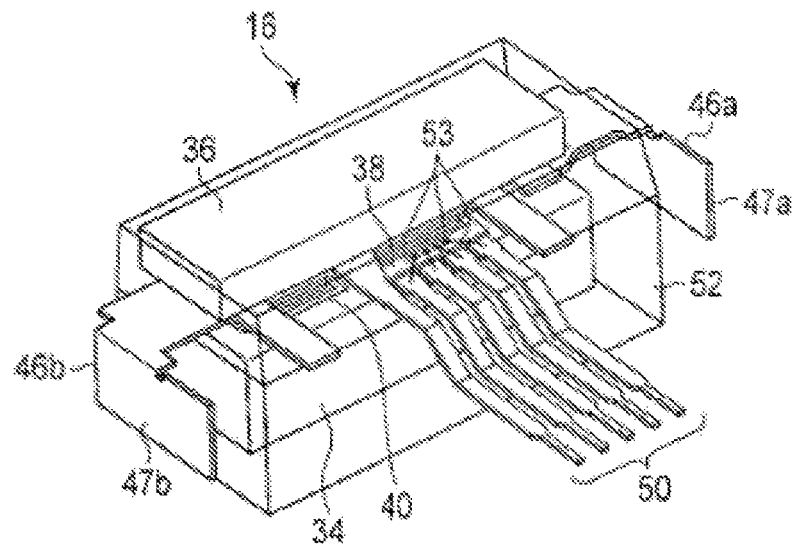
FIG. 7 is a perspective view showing the internal structure of the semiconductor module seen through the molded resin body.
Figure 8:
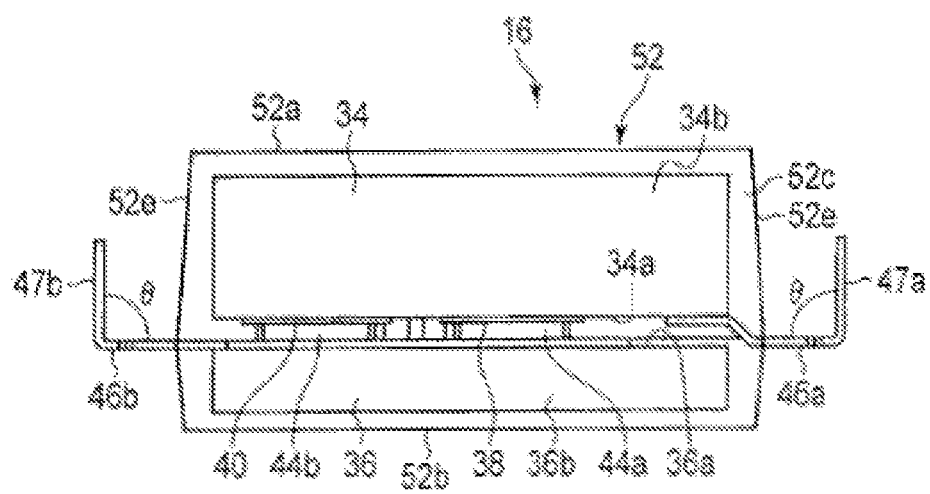
FIG. 8 is a plan view showing the internal structure of the semiconductor module seen through the molded resin body.
Figure 9:
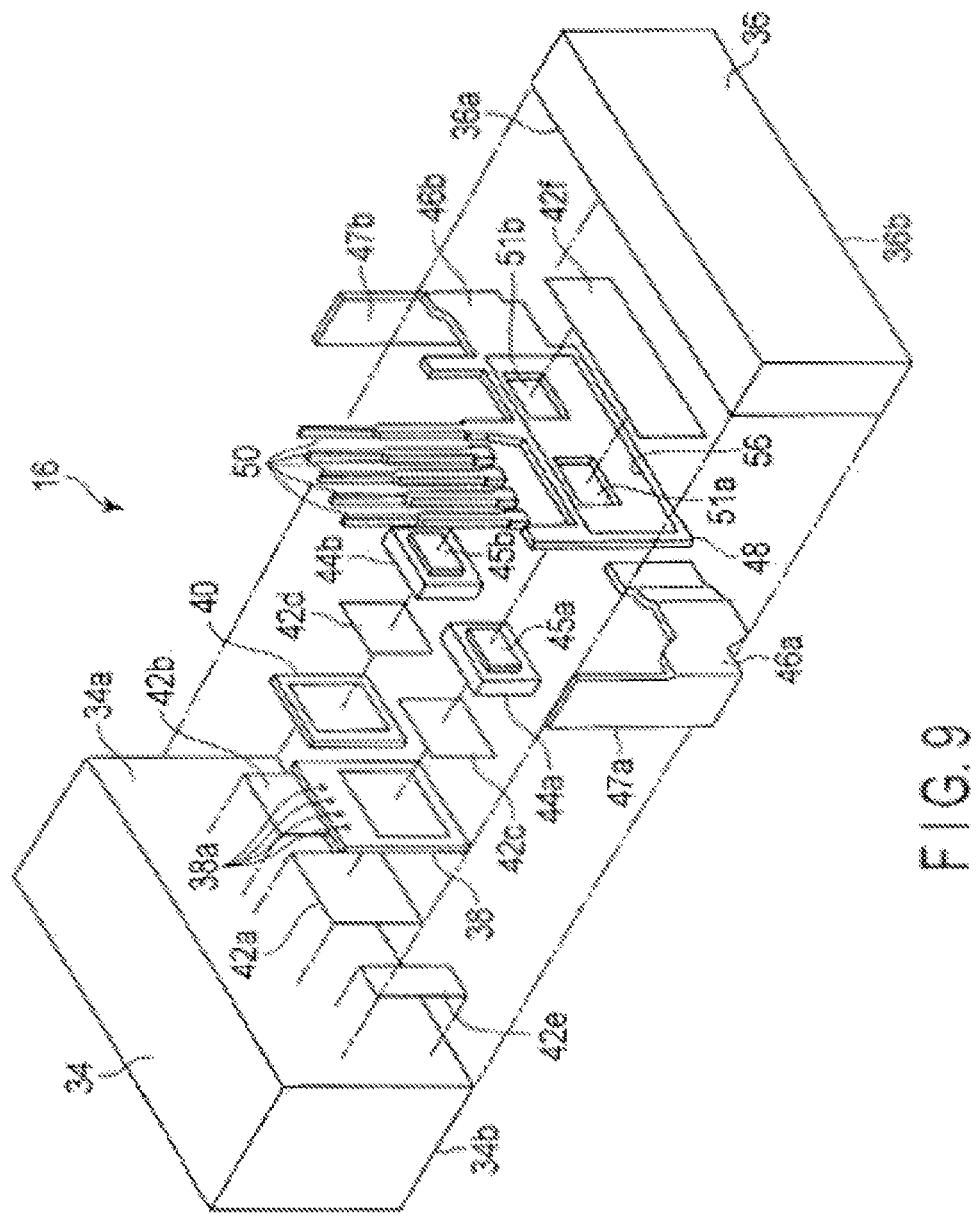
FIG. 9 is an exploded perspective view showing constituent parts of the semiconductor module.
Figure 10:
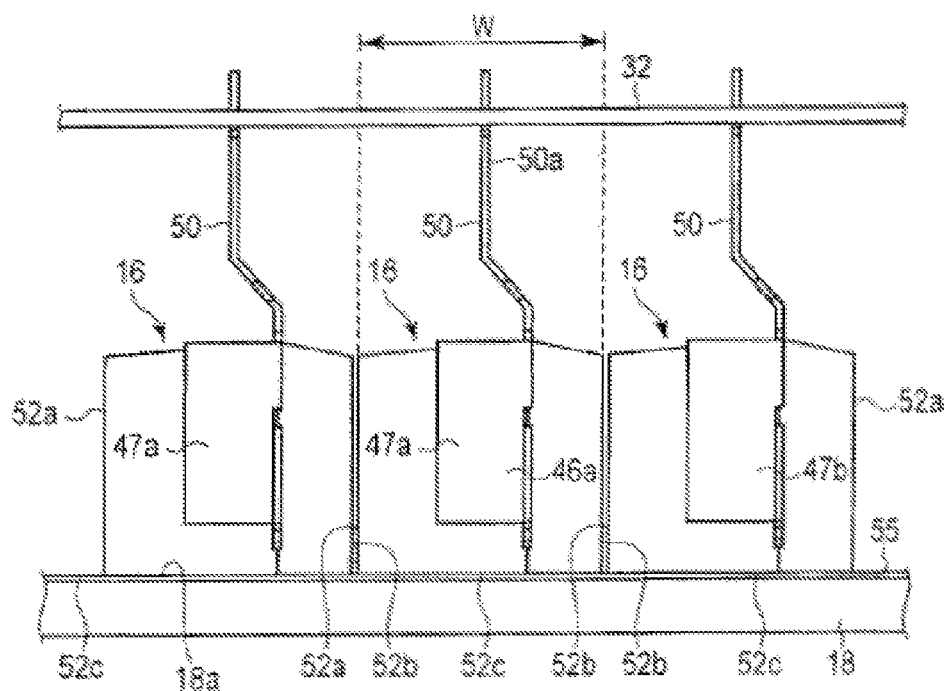
FIG. 10 is a side view showing the semiconductor module.
Figure 11:
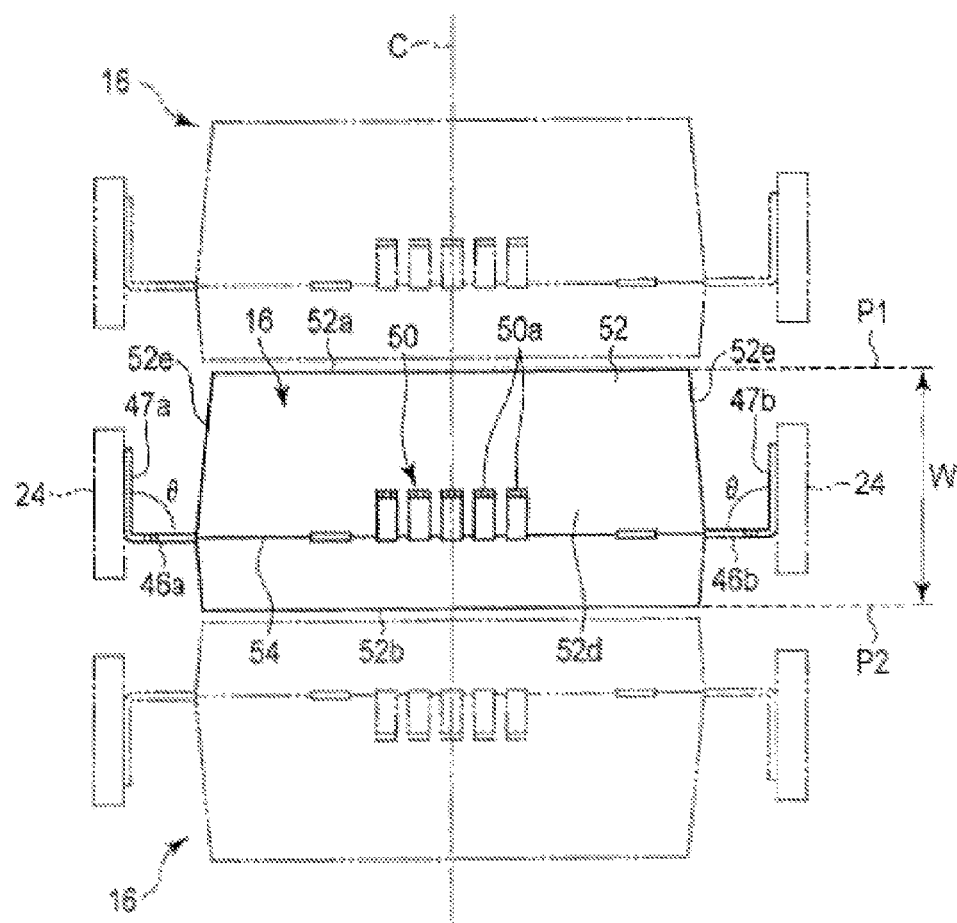
FIG. 11 is a plan view showing the semiconductor module.
Figure 12:
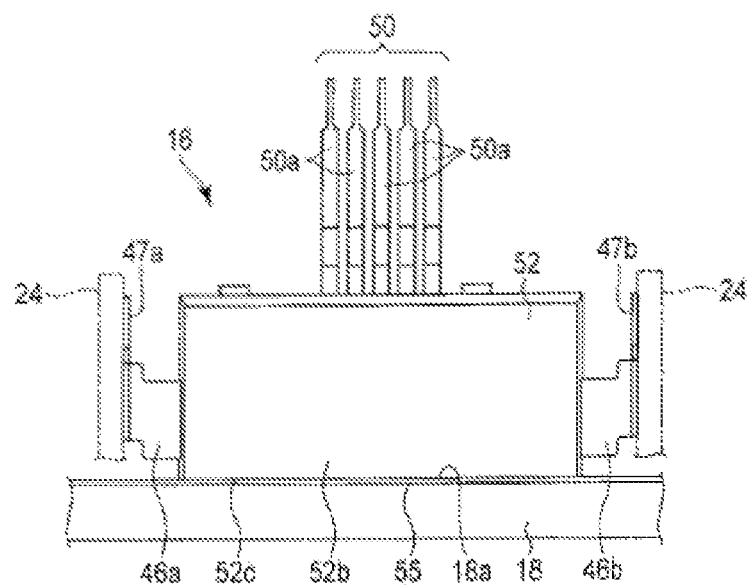
FIG. 12 is a front view showing the semiconductor module.

FIGS. 4 and 5 are perspective views showing the semiconductor module, FIGS. 6, 7 and 8 are perspective views and a plan view showing the internal structure of the semiconductor module seen through a molded resin body, and FIG. 9 is an exploded perspective view showing constituent parts of the semiconductor module. FIGS. 10, 11 and 12 are side, plan, and front views, respectively, of the semiconductor module.

As shown in FIGS. 4 to 9, the semiconductor module 16 is constructed as a power converter of the so-called double-sided cooling and vertical-mounting type. Specifically, the semiconductor module 16 comprises block-shaped first and second electrical conductors (collector and emitter) 34 and 36 of, for example, copper and first and second semiconductor elements 38 and 40 interposed between and joined to the first and second electrical conductors.

One principal surface (lateral surface) of the first electrical conductor 34 constitutes a rectangular joint surface (first joint surface) 34a, and a bottom surface (first bottom surface) 34b perpendicular to the joint surface 34a constitutes a radiating surface. The second electrical conductor 36 is substantially as long as the first electrical conductor 34 and its thickness (width) is smaller than (for example, about a third of) that of the first electrical conductor 34. Further, the second electrical conductor 36 is less tall than the first electrical conductor 34. One principal surface (lateral surface) of the second electrical conductor 36 constitutes a rectangular joint surface (second joint surface) 36a, and a bottom surface (second bottom surface) 36b perpendicular to the joint surface 36a constitutes a radiating surface. The joint surface 36a of the second electrical conductor 36 is opposed parallel to the joint surface 34a of the first electrical conductor 34. The bottom surface 36b is located flush with the bottom surface 34b of the first electrical conductor 34. The first and second electrical conductors 34 and 36 are configured so that their joint and bottom surfaces are formed at right angles or perpendicular to one another. Alternatively, however, the joint and bottom surfaces may be formed so that they cross at an angle other than 90°.

The first semiconductor element 38 is a power semiconductor element, for example, an insulator gate bipolar transistor (IGBT), while the second semiconductor element 40 is a diode. The first semiconductor element 38 is a rectangular plate formed with different electrodes on its obverse and reverse surfaces. Further, a plurality (for example, four) of connecting terminals 38a are formed on one surface of the first semiconductor element 38. The entire surfaces of the first semiconductor element 38 except areas for the electrodes and connecting terminals are covered by an insulating film of, for example, polyimide.

The second semiconductor element 40 is a rectangular plate formed with different electrodes on its obverse and reverse surfaces. The entire surfaces of the second semiconductor element 40 except rectangular areas for the electrodes are covered by an insulating film of, for example, polyimide.

The first semiconductor element 38 is disposed parallel to the joint surface 34a of the first electrical conductor 34, and its one electrode is joined to the joint surface 34a of the first electrical conductor 34 with a first connecting body, for example, a rectangular solder sheet 42a, therebetween. The second semiconductor element 40 is disposed parallel to the joint surface 34a of the first electrical conductor 34 and side by side with the first semiconductor element 38 with a gap therebetween in the longitudinal direction of the first electrical conductor 34. One electrode of the second semiconductor element 40 is joined to the joint surface 34a of the first electrical conductor 34 with a second connecting body, for example, a rectangular solder sheet 42b, therebetween.

Thus, the first and second semiconductor elements 38 and 40 are disposed parallel to the joint surface 34a of the first electrical conductor 34 and perpendicular to the bottom surface 34b of the first electrical conductor. Further, a fifth connecting body, for example, a rectangular solder sheet 42e, is provided on the joint surface 34a of the first electrical conductor 34 and located beside the first semiconductor element 38.

A first convex electrical conductor 44a for positioning is joined to the other electrode of the first semiconductor element 38 with a third connecting body, for example, a rectangular solder sheet 42c, therebetween. The first convex electrical conductor 44a is made of, for example, copper and integrally comprises a flat cuboid main body and a flat cuboid projection 45a smaller in diameter than the main body and projecting from one principal surface of the main body. The flat principal surface side of the main body of the first convex electrical conductor 44a is joined electrically and mechanically to the electrode of the first semiconductor element 38 by the solder sheet 42c.

A second convex electrical conductor 44b for positioning is joined to the other electrode of the second semiconductor element 40 with a fourth connecting body, for example, a rectangular solder sheet 42d, therebetween. The second convex electrical conductor 44b is made of, for example, copper and integrally comprises a flat cuboid main body and a flat cuboid projection 45b smaller in diameter than the main body and projecting from one principal surface of the main body. The flat principal surface side of the main body of the second convex electrical conductor 44b is joined electrically and mechanically to the electrode of the second semiconductor element 40 by the solder sheet 42d.

The first and second convex electrical conductors 44a and 44b need not always be separate parts, and their main bodies may be integrally formed so that the two projections can be provided on a common main body.

As shown in FIGS. 4 to 9, each semiconductor module 16 comprises first and second power terminals 46a and 46b, which are each formed of a lead frame or electrically conductive metal plate (not shown), junction 48 continuous with the second power terminal, and a plurality (for example, five) of signal terminals.

The first power terminal 46a is an independent structure, the proximal end portion of which is joined to the joint surface 34a of the first electrical conductor 34 by the solder sheet 42e. The first power terminal 46a projects outwardly relative to the module from one longitudinal end of the first electrical conductor 34, and its contact portion 47a is bent at right angles toward the first electrical conductor 34 and opposed substantially parallel to one end surface of the module.

The proximal end portion of the second power terminal 46b is connected to the junction 48. Further, the second power terminal 46b projects outwardly relative to the module from the other longitudinal end of the first electrical conductor 34, and its contact portion 47b is bent at right angles toward the first electrical conductor 34 and opposed substantially parallel to the other end surface of the module.

The junction 48 is an elongated rectangular plate. First and second openings 51a and 51b for positioning are formed side by side in the junction 48. The first opening 51a has such a size that the projection 45a of the first convex electrical conductor 44a can be fitted therein and is smaller than the main body of the conductor 44a. Likewise, the second opening 51b has such a size that the projection 45b of the second convex electrical conductor 44b can be fitted therein and is smaller than the main body of the conductor 44b. The surface of the junction 48 on the side of the second electrical conductor 36 is formed with a shallow rectangular recess 56, which covers an area including the first and second openings 51a and 51b. Further, the junction 48 integrally comprises three supporting projections projecting upwardly from it upper edge. One of the signal terminals 50 extends upwardly from the central supporting projection.

The junction 48 and second power terminal 46b are joined to the first and second convex electrical conductors 44a and 44b with the projections 45a and 45b of the conductors 44a and 44b in engagement with the first and second openings 51a and 51b, respectively.

Further, the junction 48 and the projections 45a and 45b of the first and second convex electrical conductors 44a and 44b are joined electrically and mechanically to the joint surface 36a of the second electrical conductor 36 by a sixth connecting body, for example, a rectangular solder sheet 42f, in the recess 56 of the junction 48. Thus, the junction 48, first and second convex electrical conductors 44a and 44b, and first electrical conductor 34 are joined to one another by the solder sheet 42f.

In this way, the electrodes of the first and second semiconductor elements 38 and 40 are electrically joined to the joint surface 36a of the second electrical conductor 36 through the first and second convex electrical conductors 44a and 44b. The semiconductor elements 38 and 40 are interposed between the first and second electrical conductors 34 and 36 and disposed parallel to the joint surfaces 34a and 36a and perpendicular to the bottom surfaces 34b and 36b of the conductors 34 and 36.

The signal terminals 50 project upwardly from the module and extend parallel to the joint surface 34a of the first electrical conductor 34. The respective proximal ends of the remaining four signal terminals 50 are connected to the connecting terminals 38a of the first semiconductor element 38 by bonding wires 53, individually.

As shown in FIGS. 4 to 8 and FIGS. 10 to 12, each semiconductor module 16 comprises an insulating material, for example, a molded resin body (insulator) 52, which covers the constituent members described above. The molded resin body 52 is a substantially rectangular block structure comprising a flat bottom surface 52c, flat first lateral surface 52a, second lateral surface 52b, ceiling surface 52d, and first and second end surfaces 52e. The bottom surface 52c extends perpendicular to the first and second semiconductor elements 38 and 40. The respective bottom surfaces 34b and 36b of the first and second electrical conductors 34 and 36 are exposed in the bottom surface 52c. The first lateral surface 52a extends perpendicular to the bottom surface 52c. The second lateral surface 52b extends perpendicular to the bottom surface 52c and is opposed parallel to the first lateral surface 52a. The ceiling surface 52d is located between the first and second lateral surfaces and opposed to the bottom surface 52c. The first end surface 52e extends across the bottom surface 52c and respective one ends of the first and second lateral surfaces. The second end surface 52e extends across the bottom surface 52c and the respective other ends of the first and second lateral surfaces. In the present embodiment, the first and second lateral surface 52a and 52b are located parallel to the joint surfaces 34a and 36a of the first and second electrical conductors 34 and 36, respectively.

The molded resin body 52 has a parting line 54 formed during forming-die cutting. The parting line 54 is formed covering the first end surface 52e, ceiling surface 52d, and second end surface 52e of the molded resin body 52 and extends parallel to the first and second lateral surface 52a and 52b. Further, the parting line 54 is offset from the center of the molded resin body 52 in a thickness direction W (FIGS. 10 and 11) toward the second lateral surface 52b, and located within a plane containing the junction 48 of the lead frame and the proximal end portions (main bodies) of the first and second power terminals 46a and 46b.

That part of the ceiling surface 52d of the molded resin body 52 which is located between the parting line 54 and first lateral surface 52a is slightly inclined toward the bottom surface 52c as it extends from the parting line 54 toward the first lateral surface 52a. That part between the parting line 54 and second lateral surface 52b is slightly inclined toward the bottom surface 52c as it extends from the parting line 54 toward the second lateral surface 52b.

That part of each end surface 52e of the molded resin body 52 which is located between the parting line 54 and first lateral surface 52a is slightly inclined toward the other end surface as it extends from the parting line 54 toward the first lateral surface 52a. That part between the parting line 54 and second lateral surface 52b is slightly inclined toward the other end surface as it extends from the parting line 54 toward the second lateral surface 52b.

As shown in FIGS. 4 to 8 and FIGS. 10 to 12, the first power terminal 46a integrally comprises a main body and the flat rectangular contact portion 47a extending from the main body. The main body projects longitudinally outwardly relative to the molded resin body 52 from its first end surface 52e in the position of the parting line 54 and is located parallel to the first lateral surface 52a. Contact portion 47a is bent toward the first lateral surface 52a at a predetermined angle θ (for example, right angle) to the main body and spacedly opposed to the first end surface 52e of the molded resin body 52. As contact portion 47a is bent, moreover, it is located in the center of the molded resin body 52 in the thickness direction W thereof, that is, within a range between first and second planes P1 and P2 that contain the first and second lateral surface 52a and 52b, respectively, or in a central part between the first and second planes P1 and P2 in this case.

The second power terminal 46b integrally comprises a main body and the flat rectangular contact portion 47b extending from the main body. The main body projects longitudinally outwardly relative to the molded resin body 52 from its second end surface 52e in the position of the parting line 54 and is located parallel to the first lateral surface 52a. Contact portion 47b is bent toward the first lateral surface 52a at the predetermined angle θ (for example, right angle) to the main body and spacedly opposed to the first end surface 52e of the molded resin body 52. As contact portion 47b is bent, moreover, it is located in the center of the molded resin body 52 in the thickness direction W thereof, that is, within the range between the first and second planes P1 and P2 that contain the first and second lateral surface 52a and 52b, respectively, or in a central part between the first and second planes P1 and P2 in this case.

Each of the five signal terminals 50 is in the form of an elongated rod projecting upwardly from the ceiling surface 52d of the molded resin body 52 in the position of the parting line 54. The five signal terminals 50 extend parallel to one another. Each signal terminal 50 comprises a proximal end portion, bent portion, and connecting end portion 50a extending from the bent portion. The proximal end portion extends parallel to the first lateral surface 52a from the position of the parting line 54, on the ceiling surface 52d. The bent portion is bent at two points spaced longitudinally relative to the proximal end portion. The connecting end portion 50a is located in the center in the thickness direction W of the molded resin body 52. Specifically, the connecting end portion 50a is located in the center between the first and second planes P1 and P2 and extends within a central plane parallel to the first and second planes.

As shown in FIG. 11, moreover, the five signal terminals 50 and first and second power terminals 46a and 46b are disposed bilaterally symmetrically with respect to a center line C that is located in the longitudinal center of the molded resin body 52. An electrically conductive film (not shown) is formed on at least the outer surface of the connecting end portion 50a of each signal terminal 50.

As shown in FIGS. 1, 10 and 12, the semiconductor modules 16 constructed in this manner are disposed in the installation space portion 22 of support frame 14 so that their respective bottom surfaces 52c are set on the heat receiving surface 18a of the cooler 12 with an insulating sheet 55 therebetween. Thus, the first and second electrical conductors 34 and 36 are thermally connected to the cooler 12 so that heat produced in the first and second semiconductor elements 38 and 40 can be released to the cooler 12 through the first and second electrical conductors 34 and 36. Contact portions 47a and 47b of the first and second power terminals 46a and 46b of each semiconductor module 16 contact their corresponding connecting terminals 24 of the bus bars 26 and are electrically connected to the bus bars 26. Further, the signal terminals 50 of each semiconductor module 16 project upwardly.

Each two adjacent ones of the plurality of semiconductor modules 16 arranged in a row are disposed in such a manner that the lateral surfaces of their respective molded resin bodies 52 adjacently face or contact one another. One of each two adjacent semiconductor modules 16 may be oriented inversely or at 180° to the other. The first and second power terminals 46a and 46b of the semiconductor modules are configured to reliably engage the connecting terminals 24 of the bus bars 26 without regard to the orientation. Regardless of the orientation, also in this case, the signal terminals 50 of each semiconductor module 16 are located in the central part of the molded resin body 52 in the thickness direction and disposed in predetermined positions relative to the control circuit board 32.

As the control circuit board 32 is set on the semiconductor modules 16, as shown in FIG. 3, the end portions of the signal terminals 50 of each semiconductor module 16 are passed through through-holes in the control circuit board 32 and electrically connected to the control circuit board by solder (not shown) or the like.

As shown in FIG. 1 and FIGS. 10 to 12, the semiconductor modules 16 constructed in this manner are set on the heat receiving surface 18*a* of the cooling block 18 with the insulating sheet 55 therebetween. Each semiconductor module 16 is placed on the heat receiving surface 18*a* in such a manner that the bottom surface 52*c* of the molded resin body 52 is in close contact with the heat receiving surface 18*a*. Thus, the bottom surfaces 34*b* and 36*b* of the first and second electrical conductors 34 and 36 closely contact the heat receiving surface 18*a* with the insulating sheet 55 therebetween. Further, contact portions 47*a* and 47*b* of the first and second power terminals 46*a* and 46*b* are individually pressed against and electrically connected to the connecting terminals 24 of the bus bars. The semiconductor modules 16 are set in such a manner that the respective first and second lateral surfaces of each two adjacent molded resin bodies 52 are opposed substantially parallel to one another with the small gaps therebetween. Since the first and second lateral surfaces of each molded resin body 52 are formed flat and parallel to each other, as described above, the plurality of semiconductor modules 16 can be arranged with very small gaps therebetween. Thus, the packaging density of the semiconductor modules 16 can be increased to reduce the size of the power converter, and the output of the power converter can be increased relative to the size.

Furthermore, all the semiconductor modules 16 may be set in the same orientation or some of them may be oriented inversely or at 180° to the others. As described before, contact portions 47*a* and 47*b* of each semiconductor module 16 and the connecting end portion 50*a* of each signal terminal 50 are provided in the central part in the thickness direction W of the molded resin body 52. Regardless of the orientation of the semiconductor modules 16, therefore, contact portions 47*a* and 47*b* are disposed in the same positions relative to the connecting terminals 24, and the signal terminals 50 are also disposed in the same positions relative to the control circuit board 32. Thus, the semiconductor modules 16 can be reliably connected to the connecting terminals 24 and control circuit board 32 without regard to their orientation.

Figure 13:
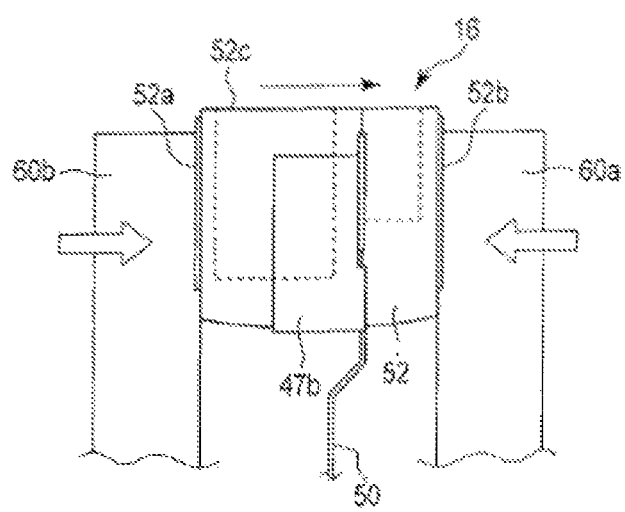
FIG. 13 is a side view showing how the semiconductor module is clamped and held by clampers as its bottom surface is ground.

In a manufacturing process for the semiconductor module 16, as shown in FIG. 13, moreover, the bottom surface of the molded resin body 52 is ground flat. Since the first and second lateral surface 52*a* and 52*b* of the molded resin body 52 are formed flat and parallel to each other, as this is done, the semiconductor module 16 can be firmly held by clamping and pressing the lateral surface 52*a* and 52*b* by means of clampers 60*a* and 60*b*. The bottom surface can be increased in flatness by being thus ground with the semiconductor module 16 held firmly. By increasing the flatness of the bottom surface 52*c* of the molded resin body 52, the bottom surface of the semiconductor module 16 can be brought into close contact with the heat receiving surface of the cooler, whereby the thermal resistance can be reduced. Thus, the cooling efficiency of the semiconductor module can be improved, and the first and second electrical conductors can be reduced in size correspondingly.

As described before, moreover, the bottom surface is ground with the semiconductor module 16 firmly held from both sides of the first and second lateral surfaces. In this way, the molded resin body and first and second electrical conductors can be prevented from being separated by grinding. Thus, the reliability of the resulting semiconductor module can be improved.

In the first embodiment, the first and second semiconductor elements 38 and 40 are disposed in such positions that the cooling efficiency is optimal for the first electrical conductor 34. Thus, in order to reduce the cost of the semiconductor device, it is effective to minimize the size of the semiconductor elements (semiconductor chips). If the size of the semiconductor elements is reduced, the current density increases, so that the chip temperature is liable to increase. Since the semiconductor elements have a working upper limit temperature value of about 150° C., a package structure is needed to minimize the increase of the semiconductor element temperature. The semiconductor element temperature over the first electrical conductor is influenced by the element positions on the first electrical conductor. Therefore, the arrangement of the first and second semiconductor elements 38 and 40 is optimized in the present embodiment.

Figure 14A:
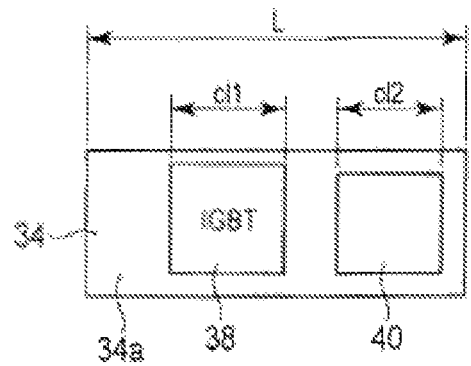
FIGS. 14A and 14B are side and sectional views, respectively, showing a model used in measuring the temperature of the semiconductor module.
Figure 14B:
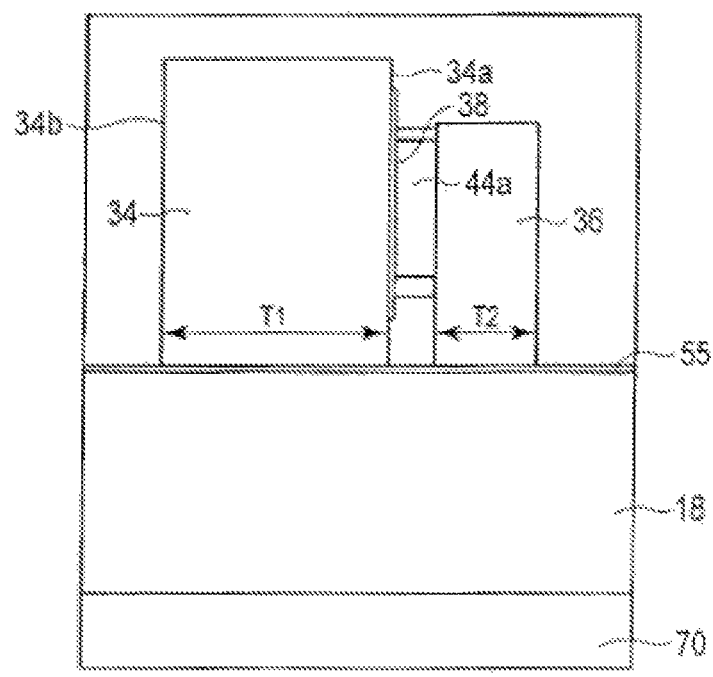
Figure 16:
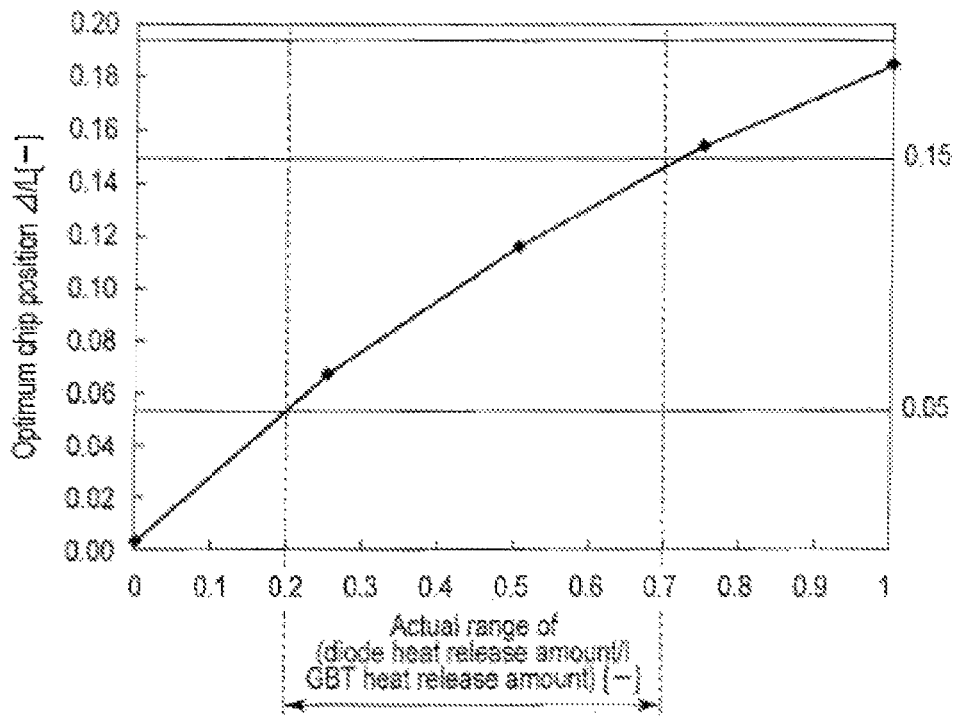
FIG. 16 is a diagram showing the relationship between the optimum arrangement position of the first semiconductor element and the ratio of the heat release amount of the second semiconductor element (diode) to that of the first semiconductor element (IGBT)

FIGS. 14A and 14B are side and sectional views, respectively, showing a model used in measuring the temperature of the semiconductor module. FIGS. 15A to 15F are diagrams showing the relationship between the temperature of the first semiconductor element and the distance from the longitudinal center of the first electrical conductor to the central position of the first semiconductor element, and the arrangement of the first and second semiconductor elements relative to the first electrical conductor. FIG. 16 is a diagram showing the relationship between the optimum arrangement position of the first semiconductor element and the ratio of the heat release amount of the second semiconductor element (diode) to that of the first semiconductor element (IGBT).

Using the model, as shown in FIGS. 14A and 14B, the heating temperature of the semiconductor elements were measured, and the relationship between the arrangement position and heating temperature of the semiconductor elements was obtained. The model comprises the first and second electrical conductors 34 and 36 and first and second semiconductor elements (IGBT and diode) 38 and 40 joined between the electrical conductors, and is not set on the heat receiving surface of the cooling block 18.

Length L and thickness T1 of the first electrical conductor 34 are set to, for example, 35 and 10 mm, respectively, and the length and thickness T2 of the second electrical conductor 36 to 35 and 4.5 mm, respectively. The chip size of the first semiconductor element (IGBT) 38 is set to 10.3 mm×10.3 mm, and that of the second semiconductor element (diode) 40 to 9.8 mm×9.8 mm, respectively. Further, the cooling block 18 is made of aluminum, whose thermal conductivity is 3,000 W/m2K.

The heating temperature corresponding to the arrangement position of the first semiconductor element 38 was measured using the model described above. In a measurement example shown in FIGS. 15A and 15B, the heat release amounts of the first and second semiconductor elements 38 and 40 are 100 and 0 W, respectively. The first semiconductor element 38 is disposed so that its center is located on a central longitudinal axis C of the first electrical conductor 34, while the second semiconductor element 40 is offset from the central axis C toward one end of the first electrical conductor. The heating temperature of the first semiconductor element 38 was measured for each of cases where the first semiconductor element 38 was disposed in a plurality of positions longitudinally offset from the central axis C of the first electrical conductor 34 by Δ (distance between the center of the semiconductor element and the central axis C) toward the other end of the first electrical conductor 34 (opposite the second semiconductor element), based on the above-described arrangement position as a reference. As seen from FIG. 15A, the heating temperature of the first semiconductor element 38 is the lowest if the semiconductor element 38 is disposed so that its center is located on the central axis C of the first electrical conductor 34. Further, it can be seen that the heating temperature of the first semiconductor element 38 increases as the semiconductor element 38 recedes from the central axis C, that is, as distance Δ between the center of the element 38 and the central axis C increases. Thus, it is evident that if the second semiconductor element 40 does not produce heat, the optimum arrangement position of the first semiconductor element 38 is in the longitudinal center of the first electrical conductor 34 (Δ/L=0).

In a measurement example shown in FIGS. 15C and 15D, the heat release amounts of the first and second semiconductor elements 38 and 40 are 100 and 25 W, respectively. As in the foregoing example, the heating temperature of the first semiconductor element 38 was measured for each of a plurality of its varied arrangement positions, that is, with distance Δ between its center and the central axis C varied sequentially. As seen from FIG. 15C, the heating temperature of the first semiconductor element 38 is the lowest if the semiconductor element 38 is slightly offset from the central axis C toward the other end of the first electrical conductor 34 with distance Δ set to about 2.4 mm (Δ/L=0.068), in contrast with the case where distance Δ is zero. It can be seen, moreover, that the heating temperature of the first semiconductor element 38 increases if distance Δ between the center of the semiconductor element 38 and the central axis C is further increased.

In a measurement example shown in FIGS. 15E and 15F, the heat release amounts of the first and second semiconductor elements 38 and 40 are 100 and 50 W, respectively. As in the foregoing example, the heating temperature of the first semiconductor element 38 was measured for each of a plurality of its varied arrangement positions, that is, with distance between its center and the central axis C varied sequentially. As seen from FIG. 15E, the heating temperature of the first semiconductor element is gradually reduced as distance Δ is increased from zero, and it is the lowest when distance Δ is about 4.2 mm (Δ/L=0.12). It can be seen, moreover, that the heating temperature of the first semiconductor element increases if distance Δ is further increased.

As described above, the optimum arrangement position of the first semiconductor element 38, that is, the arrangement position where the heating temperature of the first semiconductor element is the lowest, varies depending on the heat release amount of the second semiconductor element 40, that is, the ratio between the respective heat release amounts of the first and second semiconductor elements. In the present embodiment, as shown in FIG. 16, the ratio of the heat release amount of the second semiconductor element to that of the first semiconductor element used is set within the range of, for example, 0.2 to 0.7, and the optimum arrangement position (Δ/L) of the first semiconductor element within this range is set to 0.15 or less, preferably to 0.05 to 0.15 (Δ=0.05 L to 0.15 L).

By locating the first semiconductor element 38 in the optimum arrangement position described above, the first semiconductor element can be efficiently cooled, so that its heating temperature can be suppressed to a low level. Thus, even though the first semiconductor element is miniaturized, its heating temperature during application of the maximum current can be adjusted to 150° C. or less, so that the first semiconductor element can be made smaller. The entire semiconductor module 16 can be miniaturized by thus reducing the size of the first semiconductor element.

As the heating temperature of the first semiconductor element is reduced, moreover, the first semiconductor element can be cooled even if the first electrical conductor is made thinner, so that the first electrical conductor and the entire semiconductor module can be reduced in size.

According to the present embodiment, as described above, there can be obtained a semiconductor device capable of being miniaturized and improved in reliability and of dense installation.

The following is a description of a semiconductor device according to an alternative embodiment. In the description of this alternative embodiment to follow, like reference numbers are used to designate the same parts as those of the foregoing first embodiment, and a detailed description thereof is omitted. The following is a detailed description focused on different parts.

Second Embodiment

Figure 17:
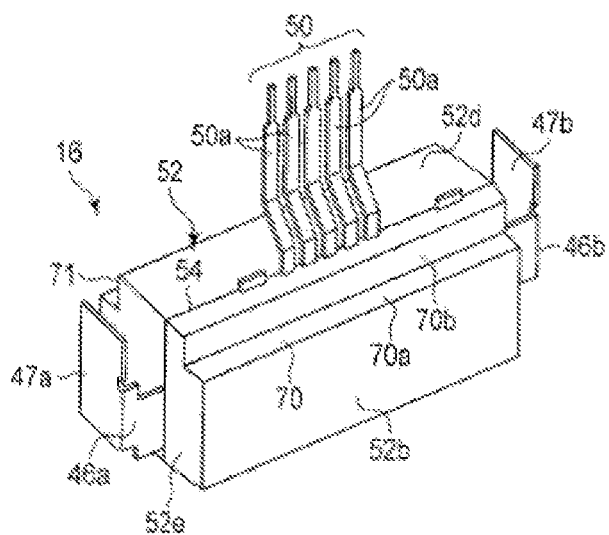
FIG. 17 is a perspective view showing a semiconductor device of a semiconductor power converter according to a second embodiment.
Figure 18:
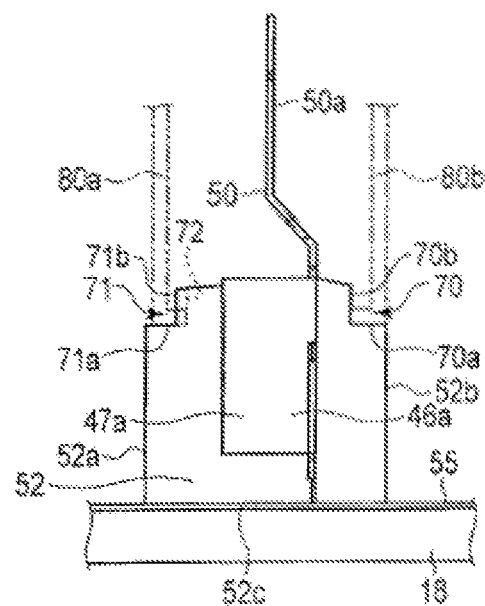
FIG. 18 is a side view of the semiconductor device according to the second embodiment.
Figure 19:
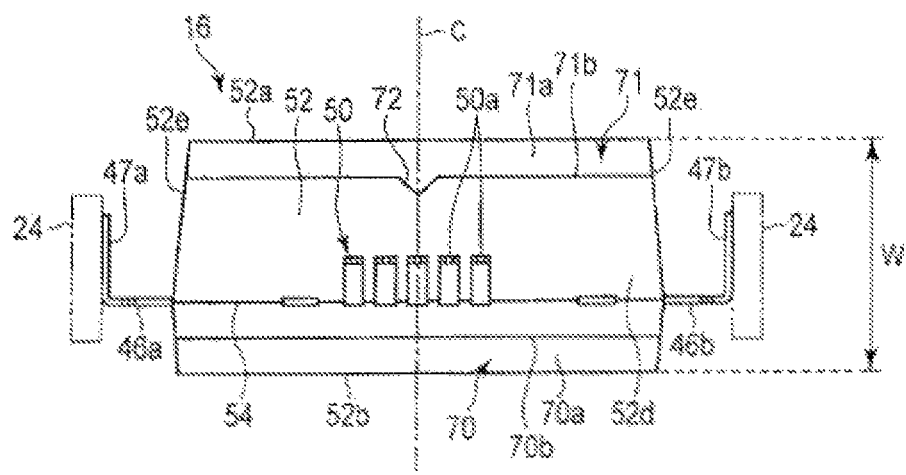
FIG. 19 is a plan view of the semiconductor device according to the second embodiment.

FIGS. 17, 18 and 19 are perspective, side, and plan views, respectively, showing a semiconductor module (semiconductor device) according to a second embodiment.

According to the second embodiment, as shown in FIGS. 17 to 19, a molded resin body 52 of a semiconductor module 16 comprises a first step portion (first recess) 71, formed at a corner portion where a first lateral surface 52a and a ceiling surface 52d cross each other, and a second step portion (second recess) 70, formed at a corner portion where a second lateral surface 52b and the ceiling surface 52d cross each other. In the present embodiment, the first step portion 71, as well as the second step portion 70, is formed throughout the longitudinal length of the molded resin body 52.

The first step portion 71 comprises a first pressing surface 71a, extending substantially parallel to a bottom surface 52c of the molded resin body 52, and a second pressing surface 71b, extending substantially parallel to the first lateral surface 52a. A positioning notch portion 72 is formed in part, for example, a longitudinal central part, of the second pressing surface 71b of the first step portion 71.

The second step portion 70 comprises a first pressing surface 70a, extending substantially parallel to the bottom surface 52c of the molded resin body 52, and a second pressing surface 70b, extending substantially parallel to the second lateral surface 52b.

Other configurations of the semiconductor module 16 are the same as those of the semiconductor module according to the first embodiment described above.

In setting the semiconductor module 16 of the second embodiment constructed in this manner in a predetermined position, as shown in FIG. 18, the semiconductor module can be held in the positions of the first and second step portions 71 and 70 by means of, for example, lifts or clampers 80a and 80b as it is lifted or moved. When this is done, the semiconductor module 16 can be held in such a manner that clampers 80a and 80b press the first pressing surfaces 71a and 70a of the first and second step portions from both sides. Also, the semiconductor module can be set under pressure in the predetermined position by pressing the second pressing surfaces 71b and 70b of the first and second step portions. Further, the position where clamper 80a holds the semiconductor module 16 can be located by engaging the clamper with the positioning notch portion 72 of the first step portion 71.

Furthermore, clampers 80a and 80b can be disposed between the first and second lateral surfaces of the semiconductor module by holding the semiconductor module in a position between the first and second step portions 71 and 70. Thus, the semiconductor module can be held as it is set in a narrow space, that is, it can be located close to the other semiconductor modules.

The first and second step portions 71 and 70 need not always be configured to extend throughout the length of the molded resin body 52, and may alternatively be provided at part of corner portions or a plurality of spots.

Figure 20:
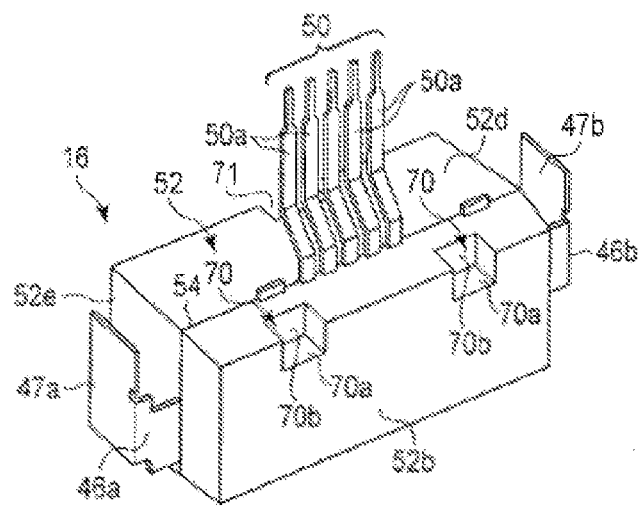
FIG. 20 is a perspective view of a semiconductor device according to a first modification.
Figure 21:
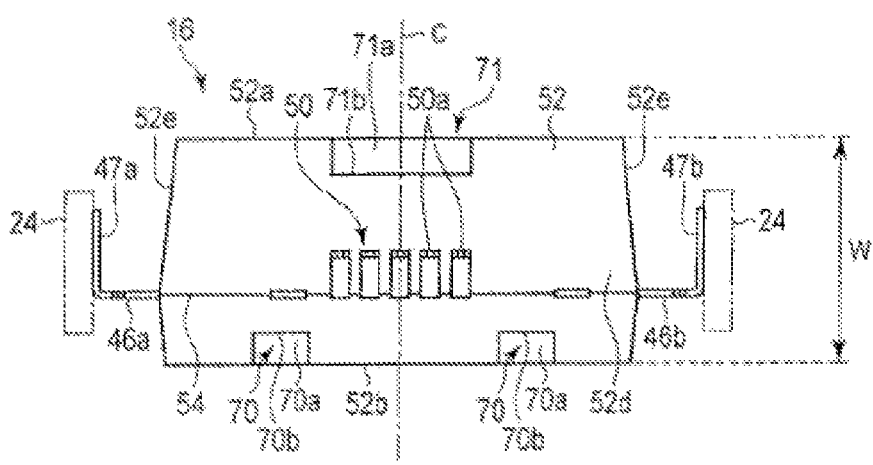
FIG. 21 is a plan view of the semiconductor device according to the first modification.

FIGS. 20 and 21 show a semiconductor module according to a first modification. According to the first modification, a first step portion 71 is formed in a longitudinal central part at one corner portion of a molded resin body 52, while two second step portions 70 are formed at the other corner portion of the molded resin body 52.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the sizes, shapes, etc., of the constituent members of the semiconductor device are not limited to those of the embodiments described above and may be changed depending on the design.

What is claimed is:

1. A semiconductor device comprising:
    a first electrical conductor comprising a first joint surface and a first bottom surface perpendicular to the first joint surface;
    a second electrical conductor comprising a second joint surface opposite the first joint surface and a second bottom surface perpendicular to the second joint surface and flush with the first bottom surface;
    a plate-like first semiconductor element which is disposed between the first and second electrical conductors, one electrode of which is joined to the first joint surface of the first electrical conductor, and the other electrode of which is connected to the second joint surface of the second electrical conductor;
    a plate-like second semiconductor element which is disposed between the first and second electrical conductors, one electrode of which is joined to the first joint surface of the first electrical conductor, and the other electrode of which is connected to the second joint surface of the second electrical conductor;
    a first power terminal comprising a proximal end portion joined to the first joint surface and extending outwardly from the first electrical conductor;
    a second power terminal extending outwardly relative to the second electrical conductor from the second joint surface;
    a signal terminal connected to the first semiconductor element; and
    a block-shaped insulator which covers the proximal end portion of the first power terminal, a proximal end portion of the second power terminal, a proximal end portion of the signal terminal, and the first and second electrical conductors,
    the insulator comprising a flat bottom surface which extends perpendicular to the first and second semiconductor elements and in which the first bottom surface of the first electrical conductor and the second bottom surface of the second electrical conductor are exposed, a flat first lateral surface extending perpendicular to the bottom surface, a second lateral surface extending perpendicular to the bottom surface and opposed parallel to the first lateral surface, a ceiling surface located between the first and second lateral surfaces and opposed to the bottom surface, a first end surface extending across the bottom surface and respective one ends of the first and second lateral surfaces, and a second end surface extending across the bottom surface and the respective other ends of the first and second lateral surfaces,
    the first power terminal, the second power terminal, and the signal terminal extending outwardly from the first end surface, the second end surface, and the ceiling surface, respectively,
    the first end surface, the ceiling surface, and the second end surface of the insulator being formed with a parting line.

2. The semiconductor device of claim 1, wherein the first power terminal comprises a main body extending parallel to the first lateral surface from the first end surface and a flat first contact portion bent relative to the main body and spacedly opposed to the first end surface, the second power terminal comprises a main body extending parallel to the first lateral surface from the second end surface and a flat second contact portion bent relative to the main body and spacedly opposed to the second end surface, and the first and second contact portions are located within a range between a first plane containing the first lateral surface and a second plane containing the second lateral surface.

3. The semiconductor device of claim 2, wherein the first contact portion is bent at right angles to the main body, and the second contact portion is bent at right angles to the main body in the same direction as the first contact portion.

4. The semiconductor device of claim 2, wherein the main body of the first power terminal extends outwardly from the position of the parting line on the first end surface, and the main body of the second power terminal extends outwardly from the position of the parting line on the second end surface.

5. The semiconductor device of claim 4, wherein the parting line is offset from a center between the first and second lateral surfaces toward the second lateral surface, and the first and second contact portions of the first and second power terminals are bent toward the first lateral surface and located in a central part between the first and second planes.

6. The semiconductor device of claim 2, wherein the parting line is offset from a center between the first and second lateral surfaces toward the second lateral surface, and the signal terminal comprises a proximal end portion extending parallel to the first lateral surface from the position of the parting line on the ceiling surface, a bent portion bent relative to the proximal end portion, and a connecting end portion extending from the bent portion and located in a center between the first and second planes and within a central plane parallel to the first and second planes.

7. The semiconductor device of claim 1, wherein the insulator comprises a first step portion, formed at a corner portion where the first lateral surface and the ceiling surface cross each other, and a second step portion, formed at a corner portion where the second lateral surface and the ceiling surface cross each other.

8. The semiconductor device of claim 7, wherein the insulator comprises a positioning notch portion formed in at least one of the first and second step portions.

9. The semiconductor device of claim 1, wherein the first and second semiconductor elements are disposed parallel to the first joint surface of the first electrical conductor.

10. The semiconductor device of claim 1, further comprising a first convex electrical conductor joined between the other electrode of the first semiconductor element and the second joint surface of the second electrical conductor and a second convex electrical conductor joined between the other electrode of the second semiconductor element and the second joint surface of the second electrical conductor.

11. The semiconductor device of claim 1, wherein the first semiconductor element is a power semiconductor element, the second semiconductor element is offset from a longitudinal center of the first joint surface of the first electrical conductor toward one longitudinal end of the first joint surface, and the first semiconductor element is disposed so that the center thereof is located within 0.05 L on the other longitudinal end side of the first joint surface of the first electrical conductor from the position of the longitudinal center of the first joint surface, where L is the longitudinal length of the first joint surface.

12. The semiconductor device of claim 11, wherein the first semiconductor element is disposed so that the center thereof is located within a range of 0.05 L to 0.15 L on the other longitudinal end side of the first joint surface from the position of the longitudinal center of the first joint surface.

* * * * *